US006296894B1

(12) United States Patent
Tanabe et al.

(10) Patent No.: US 6,296,894 B1
(45) Date of Patent: Oct. 2, 2001

(54) EVAPORATION SOURCE, APPARATUS AND METHOD FOR THE PREPARATION OF ORGANIC EL DEVICE

(75) Inventors: Hiroshi Tanabe; Satoshi Tokura; Kengo Fukuyu; Akihiro Horita; Masaaki Koishi; Toru Sasaki, all of Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/372,141

(22) Filed: Aug. 11, 1999

(30) Foreign Application Priority Data

Aug. 26, 1998 (JP) .................................... 10-256058

(51) Int. Cl.[7] .................................... C23C 16/00
(52) U.S. Cl. ......................... 427/8; 427/248.1; 118/708; 118/712; 118/726
(58) Field of Search .................... 118/726, 708, 118/712; 427/8, 248.1

(56) References Cited

U.S. PATENT DOCUMENTS

| 3,925,146 | * | 12/1975 | Olsen | .................................... | 118/726 |
| 5,493,630 | * | 2/1996 | Mariner | .............................. | 118/726 |
| 5,540,780 | | 7/1996 | Haas et al. . | | |

FOREIGN PATENT DOCUMENTS

| 0 735 157 A | 10/1996 | (EP) . |
| 55-145168 | 11/1980 | (JP) . |
| 59-100269 | 6/1984 | (JP) . |
| 63-277752 | 11/1988 | (JP) . |

OTHER PUBLICATIONS

Maissel, Handbook of Thin Film Technology, McGraw–Hill, New York, ©1970, pp. 1–120 to 1–123.*
H Usui et al: "Anthracene and polyethylene thin film depositions by ionized cluster deposition", Journal of Vacuum Science and Technology, vol. A 4 (1), Jan/Feb 1986, pp. 52–60.

Hutchings C W et al: "Apparatus For Chemical Vapor Deposition of Polyimide Films" Review Of Scientific Instruments, New York, vol. 66, (7), Jul. 1, 1995, pp. 3943–3947.

K. Yase, et al., Jpn. J. Appl. Phys., vol. 34, Part 1, No. 2A, pp. 636–637, "Evaporation Rate and Saturated Vapor Pressure of Functional Organic Materials", Feb. 1995.

K. Yase, et al., Jp. J. Appl. Phys., vol. 34, Part 1, No. 7B, pp. 3903–3905, "Direct Measurement of Molecular Flux in Organic Molecular Beam Disposition", Jul. 1995.

Japan Mechanical Academy, JSME Mechanical Engineers' Handbook, pp. A8–72 to A8–73, Apr. 15, 1987, (In Japanese With Concise Explanation).

Kobayashi, et al., Synthetic Electron Publication, Thin Film Technical Guide, pp. 24–27, Jul. 10, 1992, (In Japanese With Concise Explanation).

Taga, et al., eds., Thin–Film Forming Applied Handbook, pp. 300–301, Nov. 15, 1995, (In Japanese With Concise Explanation).

Thin Film Handbook, pp. 92–101, Dec. 10, 1983, (In Japanese With Concise Explanation).

H. Suzuki, et al., Appl. Phys. Lett. vol. 68, No. 16, pp. 2276–2278, "Organic Light–Emitting Diodes With Radio Frequency Sputter–Deposited Electron Injecting Electrodes", Apr. 15, 1996.

* cited by examiner

Primary Examiner—Richard Bueker
(74) Attorney, Agent, or Firm—Oblon, Spivak, McClelland, Maier & Neustadt, P.C.

(57) ABSTRACT

An evaporation source includes an insulating container adapted to receive a volume of source material therein and a heater closely disposed around the container for heating and evaporating the source material into a vapor. The effective contact area of the container in contact with the source material is correlated to the volume of source material. The evaporation source is useful in the preparation of organic EL devices.

13 Claims, 4 Drawing Sheets

EVAPORATION SOURCE, APPARATUS AND METHOD FOR THE PREPARATION OF ORGANIC EL DEVICE

This invention relates to an apparatus and method for preparing an organic electroluminescent (EL) device, and more particularly, to an apparatus and method for preparing an organic EL device using an evaporation process of heating and evaporating an organic source material, thereby depositing the material on a selected region of a substrate to form a thin film thereon. Specifically, it relates to an evaporation source for use in the evaporation process.

BACKGROUND OF THE INVENTION

Vacuum evaporation is well known as one of basic thin-film forming processes. In the vacuum evaporation process, an evaporation source and a substrate are placed in a vacuum chamber, and a source material is evaporated to deposit a thin film on the substrate. A variety of evaporation sources are known. One typical process is a resistance heating evaporation process of conducting electric current across a metal container or boat having a relatively high electric resistance to generate heat with which a source material is evaporated, as described in Appl. Phys. Lett., 68 (16), Apr. 15, 1996, for example. Also known is an electron beam/laser beam evaporation process of directly irradiating electron beams or laser beams to a source material for evaporating the material with the beam energy. Of these, the resistance heating evaporation process is widely used in the art because the deposition apparatus is of simple construction so that thin films of quality can be formed at a low cost.

In the resistance heating evaporation process, a metal material having a high melting point such as tungsten, tantalum or molybdenum is worked into a thin plate having a high electric resistance, from which a container or boat is made. A source material is placed in the container, which is disposed in a (vacuum) chamber. Direct current is conducted across the container to generate heat, with which the source material is evaporated to feed a source material gas. A part of the dispersing gas deposits on the substrate to form a thin film. As the source material to be evaporated, any of materials having a relatively high vapor pressure may be used although the material that is chemically reactive with the container should be avoided.

Recently, active research works have been made on organic EL devices. As a basic configuration, the organic EL device includes a hole injecting electrode, a thin film formed thereon by depositing a hole transporting material such as triphenyldiamine (TPD), a light emitting layer deposited thereon of a fluorescent material such as an aluminum quinolinol complex (Alq3), and a metal electrode or electron injecting electrode formed thereon from a metal having a low work function such as magnesium. Such organic EL devices are attractive in that they can achieve a very high luminance ranging from several 100 to several 10,000 cd/m$^2$ with a drive voltage of approximately 10 volts.

In the prior art method of manufacturing organic EL device-applied products, functional thin films of organic materials are formed using the evaporation process. It is crucial for such commercial mass-scale manufacture to increase the productivity and to reduce the percent rejection. However, manufacturing apparatus using prior art evaporation devices are difficult to achieve mass production and to manufacture products of uniformity and hence, high quality because of a low film deposition rate and non-uniformity in thickness and composition of organic layers during the mass-scale manufacturing process. When a functional thin film such as an electron injecting electrode is deposited on the organic layer, the organic layer can be damaged or inversely, the electron injecting electrode itself be contaminated with impurities or oxidized. These lead to defectives such as non-uniform luminance, dot defects, and current leakage as well as quality variances.

The evaporation boat is easy to control the rate of evaporation since direct resistance heating is possible. The boat, however, can accommodate therein only a small amount of a source material, lacking a practical utility from the industrial aspect.

On the other hand, a cell type evaporation source can contain a larger amount of source material, but is low in thermal response because of indirect heating. As a consequence, it is difficult to control the rate of evaporation. The percent utilization of the source material becomes low when the rate of evaporation is set constant. This makes it difficult to reduce the cost of products particularly when an expensive organic material is used. Also, in the case of evaporation at a relatively low temperature from the cell type evaporation source as in the deposition of organic layers in organic EL devices, the thermal response is further exacerbated because of poor radiating efficiency.

In particular, light emitting layers of organic EL devices are often formed by doping a host material with a minor amount of fluorescent material so as to adjust to the desired luminous characteristics. Even a slight shift in the amount of host material or dopant in the mixed layer can jeopardize the luminous characteristics. For these and other reasons, prior art evaporation equipment are difficult to achieve uniformity of products or produce EL devices of high quality, especially in the mass-scale manufacture process.

SUMMARY OF THE INVENTION

An object of the invention is to provide an evaporation source for use in the preparation of an organic EL device which is capable of containing a large amount of source material, enables stable evaporation over a long period of time, enables to adjust and maintain uniform the thickness and composition of a thin film, and allows for evaporation at relatively low temperatures or on a substrate with a relatively large surface area.

Another object of the invention is to provide an apparatus and method for the preparation of an organic EL device, using the evaporation source.

A further object of the invention is to provide an evaporation source, apparatus and method for the preparation of an organic EL device which can control at high precision the mixing ratio or doping amount in multi-source evaporation.

In a first aspect, the invention provides an evaporation source for use in the preparation of organic electroluminescent devices, comprising a container of an insulator having a volume of source material received therein, and a heater closely surrounding the container for heating and evaporating the source material into a vapor. The container includes a heating zone which is directly heated by the heater and which is in contact with the source material over an effective contact area. The effective contact area which is equal to S cm$^2$ and the volume of source material which is equal to V cm$^3$ are controlled to meet V/S≦1 cm.

Several preferred embodiments are given below. (1-1) The container has a bottom and a side wall which together define the heating zone. (1-2) The container has a bottom and a side wall which together define the heating zone, the container further has a raised portion extending from the bottom, and the heating zone is also associated with the raised portion. (1-3) The container defines an opening over the heating zone, the vapor of the source material scatters through the opening, a vapor density $m_0$ appears at a vertical distance $L_0$ from the center of the opening, a vapor density m appears at a position spaced a distance L from the center of the opening at an angle θ, and the value of n obtained by approximating the vapor density m to be $m = m_0 \cdot (L_0/L)^2 \cdot \cos^n \theta$ is not greater than 6. (1-4) The heater is capable of evaporating the source material at a maximum evaporation rate of at least 150 μg/sec. (1-5) The maximum volume of the source material is at least 5 cm$^3$. (1-6) The source material is a sublimable material which is utilized at an efficiency of at least 85%. (1-7) The insulator of the container has a thermal conductivity of at least 50 W/m·k. (1-8) The heater is surrounded by a layer of an insulator having a thermal conductivity of at least 50 W/m·k. (1-9) The insulator of the container or the insulator of the surrounding layer or both are pyrolytic boron nitride, and the heater comprises carbon.

In a second aspect, the invention provides an apparatus for preparing an organic electroluminescent device, comprising the improved evaporation source, a substrate on which the organic electroluminescent device is to be formed, a means for detecting the rate of evaporation of the source material on the substrate, and a means for controlling the evaporation source in accordance with information from the detecting means.

Several preferred embodiments are given below. (2-1) The control means controls so as to keep the evaporation rate constant. (2-2) The control means controls the temperature of the evaporation source. (2-3) The control means controls the temperature of the evaporation source and then controls so as to keep the evaporation rate constant. (2-4) The source material is an organic material which evaporates at a temperature of up to 800° C.

In a third aspect, the invention provides a method for preparing an organic electroluminescent device on a substrate, using the improved evaporation source. The method involves the steps of actuating the heater for heating and evaporating the source material, detecting the rate of evaporation of the source material on the substrate to acquire information, and controlling the evaporation source in accordance with the information, thereby depositing the source material on the substrate.

Several preferred embodiments are given below. (3-1) The controlling step is to keep the evaporation rate constant. (3-2) The controlling step is to control the temperature of the evaporation source. (3-3) The controlling step is to control the electric current or power applied to the heater of the evaporation source. (3-4) The controlling step includes controlling the temperature of the evaporation source and then controlling so as to keep the evaporation rate constant. (3-5) The source material is an organic material which evaporates at a temperature of up to 800° C.

BRIEF DESCRIPTION OF THE INVENTION

These and other objects, features and advantages of the invention will be better understood by reading the following description, taken in conjunction with the accompanying drawings.

DESCRIPTION OF THE PREFERRED EMBODIMENTS

The evaporation source for use in the preparation of organic EL devices according to the invention includes an insulating container having a volume of source material received therein, and a heater closely surrounding the container for heating and evaporating the source material into a vapor. The container includes a heating zone which is directly heated by the heater and which is in contact with the source material over an effective contact area. Provided that the effective contact area is equal to S cm$^2$ and the volume of the source material is equal to V cm$^3$, the invention requires V/S ≦ 1 cm.

Since the container of the evaporation source is formed from an insulator and closely surrounded by the heater, the evaporation source has a very good thermal response and is adapted for the control of the evaporation rate. Satisfying V/S ≦ 1 cm wherein the effective contact area is equal to S cm$^2$ and the volume of the source material is equal to V cm$^3$ ensures evaporation at a high rate and a high precision and therefore, the deposition of a thin film of uniform thickness and uniform composition.

The heating zone of the container which is directly heated by the heater includes the inside surface portion of the container corresponding to the surrounding heater and an additional inside surface portion of the container which extends therefrom a distance of about 3 mm, specifically a distance of less than the thickness of the container wall. Provided that the effective contact area of the heating zone with the source material is equal to S cm$^2$ and the volume of the source material is equal to V cm$^3$, the invention requires that V/S is up to 1 cm, preferably from about 0.2 to 0.9 cm, and more preferably from about 0.4 to 0.8 cm. The effective contact area of the heating zone in contact with the source material is the inside surface area of the container (including its bottom, side wall and optional raised portion and surrounded by the heater) that is in contact with the source material. The volume of the source material V (cm$^3$) is preferably at least 10 cm$^3$, and more preferably 20 to 100 cm$^3$. The maximum volume of the source material that can be admitted into the container should preferably be smaller than the interior volume of the container. The reason is that a slight drop of temperature occurs at the opening of the container because of radiation due to evaporation and heat dissipation to a holder or similar member, and an extra heating zone is thus necessary for compensating for such a temperature drop.

The container of the evaporation source is formed from an insulator having a thermal conductivity of at least 50 W/m·k, preferably at least 75 W/m·k, more preferably at least 100 W/m·k, and most preferably at least 125 W/m·k. The upper limit of thermal conductivity is not critical although it is usually about 300 W/m·k. Exemplary insulators having such a thermal conductivity include aluminum nitride, boron nitride, and pyrolytic boron nitride (PBN), with the PBN being preferred. Pyrolytic boron nitride may be formed by CVD or other processes. Whether or not boron nitride is pyrolytic can be determined by an analysis of crystal structure by x-ray diffractometry (XRD). Specifically, in the case of pyrolytic boron nitride, a peak of the [002] face is mainly detected in XRD among hexagonal BN crystal orientations, and its intensity is outstandingly greater than those of other faces such as [100], [101], [102], and [001], which is different from the x-ray peaks of other hexagonal BN. Pyrolytic boron nitride has the composition of BN, but may somewhat deviate from the stoichiometry.

Around the container of the evaporation source is closely arranged the resistance heater. The heater is not critical as long as it can be formed in close contact with the outer periphery of the evaporation source container. For example, graphite is directly deposited on the container to form a thin film thereof, or a film heater comprising polyimide and stainless steel foils is attached to the container. Of these, the graphite thin film directly deposited on the container is preferred because of a good thermal response. The graphite used herein may be pyrolytic graphite (PG). The pyrolytic graphite can be formed by CVD or other processes. The pyrolytic graphite by CVD is more firmly and closely joined to the container.

Typically the container has a bottom and a side wall which together define the heating zone. That is, the heater closely surrounding the container is preferably formed at least on the side wall and bottom of the container to define the heating zone thereat. The container having the heating zone along its side wall and bottom enables rapid accurate evaporation in good response. In one preferred embodiment, the container further has a raised portion extending from the bottom, and the heating zone is also associated with the raised portion. More particularly, the container has a hollow raised portion vertically extending from the bottom, especially at its center, and the heater is also formed in close contact with the outside surface of the raised portion of the container. Typically, the container is of cylindrical shape having an open top and a closed bottom, and preferably having an annular flange or collar radially extending from the top. The heater on the side wall of the cylindrical container may be formed from immediately below the flange, or from the transition between the flange and the side wall, or from the flange to the side wall. By extending the heater on the side wall to immediately below the flange or along the flange, it becomes possible to prevent the vapor from depositing on the flange and prevent the temperature lowering phenomenon that otherwise occurs at the opening of the container because of radiation and heat dissipation to a holder or similar member.

The heat release value of the heater may be determined as appropriate depending on the dimensions of the evaporation source, the type of source material, the area to be covered, etc. Usually, an input power of about 50 to 500 W is applied to the heater while the heater has a resistance per unit length of about 3 to 3,000 Ω.

It is recommended that the heater is further surrounded by a layer of an insulator having a thermal conductivity of at least 50 W/m·k. The provision of the outside insulator layer ensures insulation and improves the inward heat transfer from the heater. The preferred insulators used herein are the same as the above-mentioned insulators, especially PBN.

The dimensions of the evaporation source may be determined as appropriate depending on the scale of the overall system and the size of a substrate on which a material is to be evaporated. When the container is a cylindrical crucible with an annular flange or collar, its inner diameter is usually about 5 to 100 mm and preferably about 20 to 100 mm. The outer diameter of the container is approximately equal to the inner diameter plus the flange width (both sides) of 30 to 70 mm, especially 40 to 60 mm. The depth of the cylindrical crucible is about 5 to 200 mm and preferably about 5 to 100 mm. The wall gage is usually about 0.3 to 5.0 mm and preferably about 0.5 to 2 mm when the breakage resistance and heat transfer of the container are taken into account. The depth of the container to which the source material can be admitted is closely correlated to the area of the opening. When the heating zone is defined by the side wall and bottom of the container, the opening area is preferably at least about 10 cm$^2$ and more preferably about 20 to 80 cm$^2$ and the material-receiving depth of the container is preferably up to about 20 mm and more preferably about 5 to 15 mm. In the preferred embodiment wherein the container has a raised portion extending from the bottom and externally lined with the heater, the opening area is preferably at least about 5 cm$^2$ and more preferably about 8 to 40 cm$^2$ and the material-receiving depth of the container is preferably up to about 200 mm and more preferably about 20 to 100 mm.

The maximum volume of source material that can be admitted into the container is usually at least 10 cm$^3$ and preferably about 20 to 100 cm$^3$, although it varies with the shape of the container.

In the evaporation source of the invention, the heater is preferably capable of evaporating the source material at a maximum evaporation rate of at least 150 µg/sec, more preferably at least 200 µg/sec and most preferably 250 to 500 µg/sec.

Several requirements are imposed on the evaporation source. It is required that (1) precise and steady temperature control is possible, (2) the deposition rate is high enough to accommodate mass production, (3) the container can receive a sufficient amount of source material to cover large size substrates, (4) the container is not chemically reactive with constituent materials of organic EL devices, and (5) a source material can be evaporated to a desired vapor state and diffused in a stable manner. Of these, requirements (1) to (4) are already discussed. Preferably the evaporation source of a shape satisfying these requirements is used. One preferred evaporation source is a Knudsen cell. The Knudsen cell is a cell having a predetermined opening as a vapor effusion port. Provided that the opening has a diameter d and a thickness t, the distribution of vapor density exiting from the effusion port takes the shape of a candle flame and is approximated by the shape of $\cos^n \theta$. The value of n is given by approximating a vapor density m at an arbitrary position relative to the vapor density $m_0$ at the center by $m=m_0 \cdot \cos^n \theta$. Therefore, a vapor density $m_0$ appears at a vertical distance $L_0$ from the center of the opening, a vapor density m appears at a position spaced a distance L from the center of the opening at an angle θ, and the value of n obtained by approximating the vapor density m to be $m=m_0 \cdot (L_0/L)^2 \cdot \cos^n \theta$. As d/t decreases, the n value increases and the shape of a flame becomes acute. In case of t=0 at the extremity, n=1 resulting in a spherical distribution standing on the opening. This corresponds to the evaporation from an open liquid surface and is known as Langmuir evaporation. Preferably n has a value of up to 6, and especially from 3 to 5.

Also preferably, the evaporation source is disposed relative to the substrate such that the angle between a line connecting the center of the opening of the evaporation source and the center of the substrate and the surface of the substrate is from 20° to 60°, preferably from 30° to 60°. By effecting evaporation from an oblique direction with respect to the substrate surface, step coverage is improved. Then an organic layer is formed so as to cover any contaminant or foreign particle on a substrate (or a hole injecting electrode or in the case of a reversely stacked structure, an electron injecting electrode), avoiding the occurrence of current leakage. Additionally, the electron injecting electrode such as a metal thin film or the hole injecting electrode such as ITO is improved in film physical properties. If the angle between the line connecting the centers of the evaporation source opening and the substrate and the substrate surface is more than 60°, step coverage is aggravated. Another problem associated with an angle of more than 60° is that as the substrate size increases, the distance between the evaporation source and the substrate must be increased in order to achieve a uniform film thickness distribution, which results in a lower deposition rate. If the angle is less than 20°, the film thickness distribution becomes non-uniform and the distance between the substrate and the evaporation source must be increased along an extension line of that angle in order to achieve a uniform film thickness distribution, which undesirably requires an apparatus of greater size beyond the practically acceptable size.

Understandably, the substrate may be inclined relative to a horizontal plane. In this case, the angular relationship between the substrate and the evaporation source is maintained the same as above. The angle of the substrate relative to the horizontal plane is usually from 0° to 60° although it is not particularly limited insofar as the angle between the substrate and the evaporation source falls within the above-defined range. As long as the above requirements are met, the substrate may be stationary or rotating. Rotation of the substrate further improves step coverage and allows a film of uniform quality and thickness distribution to deposit.

A too close distance between the substrate and the evaporation source tends to obstruct uniform evaporation over the entire surface of the substrate whereas a too long distance tends to lower the deposition rate. Then, the distance between the substrate and the evaporation source, that is, the minimum distance between the horizontal plane where the center of the opening of the evaporation source is located and the horizontal plane where the center of the substrate is located is preferably 1.0 to 3.0 times, more preferably 1.5 to 2.5 times the distance between the center and the edge of the substrate. A plurality of evaporation sources may be arranged concentrically about the substrate center, all within the above range of substrate-to-source distance. In this case, co-evaporation may be effected.

The improved evaporation source allows for efficient utilization of the source material, particularly when a sublimable material is used, the percent utilization of the material (the quantity of depositable material divided by the quantity of charged material) can be at least 85%, more preferably at least 90%, and most preferably at least 95%. An expensive organic material can be efficiently utilized without substantial waste, contributing to a manufacture cost reduction.

Preferably the evaporation source has a gas cooling system which is shielded from the atmosphere of the evaporating chamber. The gas cooling system provides an improved cooling effect, with which the thermal response rate is increased. This embodiment is effective especially for the low-temperature evaporation of organic materials. One exemplary cooling system includes a jacket disposed outside the evaporation source container with the heater integrally formed therewith so as to define a space between the container and the jacket wherein a gas coolant is circulated through the space. The jacket is tightly joined to the container using O-rings or other sealing members. The cooling system is sealed in this way in order to maintain the vacuum within the evaporating chamber.

The gas coolant is preferably a gas having a predetermined thermal conductivity, least reactivity with the cell, and ease of handling. Specifically, the coolant gas preferably has a thermal conductivity of at least 0.015 W/m·k, more preferably at least 0.025 W/m·k, and most preferably at least 0.15 W/m·k. Examples of the coolant gas include inert gases such as He, Ne and Ar and least reactive gases such as nitrogen ($N_2$). Helium and nitrogen gases are preferred among others. A mixture of two or more of these gases is also useful while the mixing ratio is arbitrary.

The flow rate of the gas coolant varies with the heat capacity of the evaporation source, the heat release value of the heater, etc. although it is usually about 50 to 5,000 SCCM. The manner of controlling the flow rate is not critical although a mass flow control mode is preferable. The direction of gas coolant flow is typically upward.

Figure 1A:
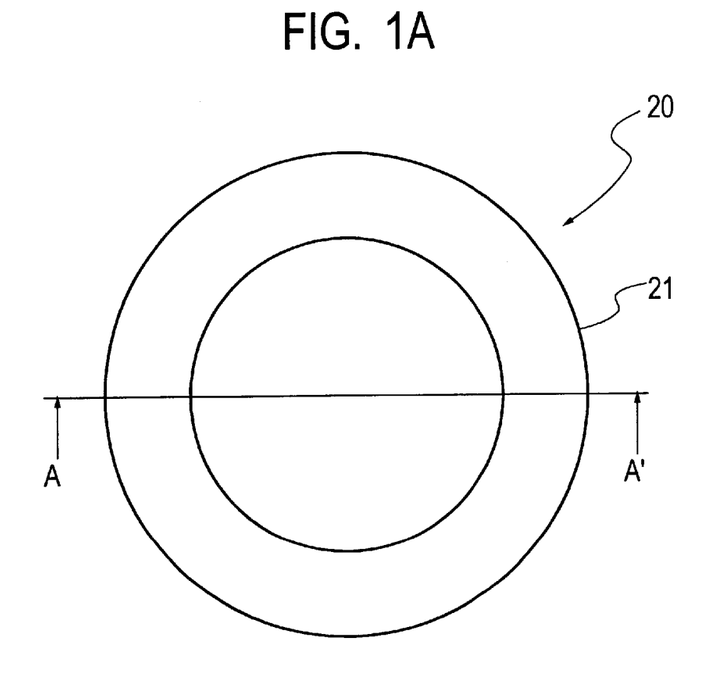
FIGS. 1A and 1B are plan and cross-sectional views of an evaporation source according to one embodiment of the invention.
Figure 1B:
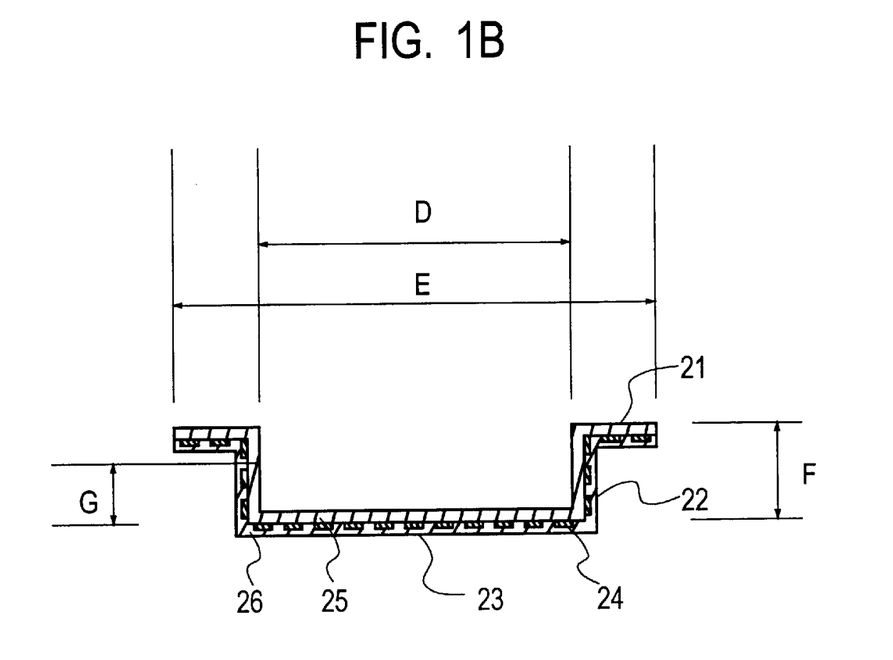

Now, a more illustrative construction of the evaporation source according to the invention is described. Referring to FIG. 1, there is illustrated an exemplary evaporation source 20 according to one embodiment of the invention. FIG. 1A is a plan view and FIG. 1B is a cross-sectional view taken along line A–A' in FIG. 1A. The evaporation source 20 includes a cylindrical container 25 having a side wall 22 and a bottom 23 as well as an annular flange 21. A heater 24 closely surrounds the container 25. Specifically, the heater 24 is formed on the outside surface of the container 25 to a predetermined pattern (e.g., helical pattern) using pyrolytic graphite. An insulating layer 26 covers the heater 24. Specifically, the insulating layer 26 is formed on the heater 24 using the same material as the container 25. In the illustrated embodiment, the heater 24 further extends along the flange 21 for preventing the vapor from depositing on the flange 21.

As depicted in FIG. 1, the container 20 has an inner diameter D, an outer diameter E and a depth F, while G designates the depth or height to which the source material is admitted.

Figure 2A:
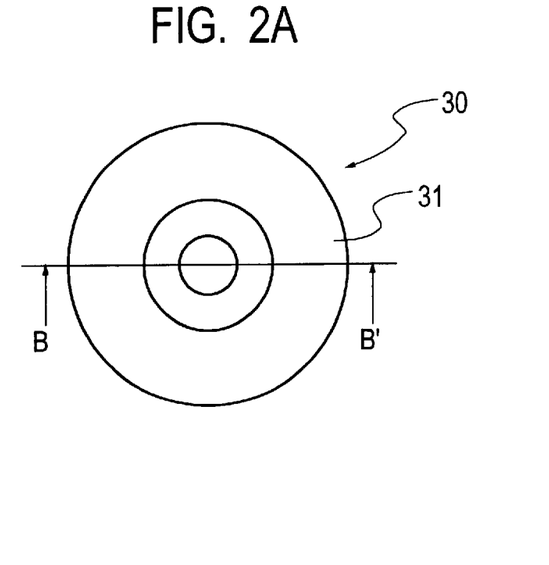
FIGS. 2A and 2B are plan and cross-sectional views of an evaporation source according to another embodiment of the invention.
Figure 2B:
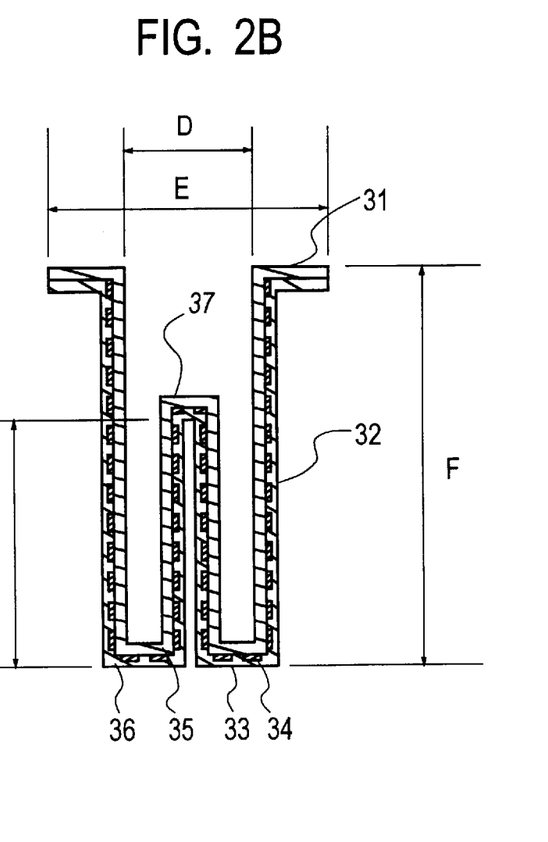

Referring to FIG. 2, there is illustrated an exemplary evaporation source 30 according to another embodiment of the invention. FIG. 2A is a plan view and FIG. 2B is a cross-sectional view taken along line B–B' in FIG. 2A. The evaporation source 30 includes a generally cylindrical container 35 having a side wall 32 and a bottom 33 as well as an annular flange 31. The container 35 further has a raised portion 37 in the form of a concentric inner cylinder. A heater 34 closely surrounds the container 35. Specifically, the heater 34 is formed on the outside surface of the container 35 to a predetermined pattern using pyrolytic graphite. An insulating layer 36 covers the heater 34. Specifically, the insulating layer 36 is formed on the heater 34 using the same material as the container 35. In this embodiment, the heater 34 and the insulating layer 36 also extend along the outside surface of the inner cylinder 37. Herein, the inside surface of the container is to receive the source material or define the heating zone, and the opposite surface of the container is designated the outside surface.

Also in FIG. 2, the container 30 has an inner diameter D, an outer diameter E and a depth F, while G designates the depth or height of the source material charge.

The second aspect of the invention is an apparatus for preparing an organic EL device, comprising the improved evaporation source, a substrate on which the organic EL device is to be formed, a means for detecting the rate of evaporation of the source material on the substrate, and a means for controlling the evaporation source in accordance with information from the detecting means.

The means for detecting the rate of evaporation of the source material is not critical insofar as it can detect a time series change of the amount of source material depositing on the substrate. A choice may be made among well-known evaporation rate detectors. Illustratively, a detector is combined with an oscillator (e.g., of quartz) such that a source material deposited on the oscillator is detectable as a change of natural oscillation of the oscillator.

A signal or information representative of the evaporation rate detected by the detector is delivered to the control means. Based on the signal or information representative of the evaporation rate from the detector, the control means controls the evaporation source so as to maintain the evaporation rate constant. To this end, the control means directly controls the electric current or power applied to the heater of the evaporation source. If a temperature control system is built in the existing evaporation apparatus or available as an off-the-shelf product, the control means cooperates with the temperature control system so as to achieve the predetermined temperature.

The desired range within which the evaporation rate is to be controlled varies with the type of source material, etc. For organic materials of organic EL devices, the evaporation rate is desirably in the range of 0.05 to 0.6 nm/sec, more desirably 0.1 to 0.5 nm/sec, most desirably 0.3 to 0.5 nm/sec, as measured at a height straight above the opening of the evaporation source and corresponding to the position of the substrate. It is noted that if the source material is a mixture of a host material and a dopant, the evaporation rate of the host material is usually in the above range while the evaporation rate of the dopant is in a range of 0.1 to 10% of the evaporation rate of the host material.

The source material to be evaporated is not critical insofar as it is a constituent material of organic EL devices. It is preferred that the evaporating temperature of the source material that is equal to the temperature of the evaporation source during evaporation is up to 800° C., preferably up to 500° C. The lower limit is not critical although it is usually about 150° C. Of these source materials, organic materials used in light emitting layers to be described later are especially preferred. This is because such organic materials are evaporated at relatively low temperatures and a slight change of the dose or mixing amount of a dopant has a significant influence on the device characteristics. Therefore, the present invention is effective particularly when accurate control of evaporating amounts is requisite as in the case of multi-source evaporation of organic materials.

The main control means is not particularly limited in construction insofar as it can analyze the information delivered from the evaporation rate detecting means and carry out heater control in accordance therewith. The control means is usually a general-purpose microprocessor (MPU) which is combined with a storage medium (ROM, RAM, etc.) bearing a control algorithm. Any of microprocessors including CISC, RISC, and DSP may be used as the control means. Besides, the control means may be constructed by ASIC, a combination of logic circuits by common ICs, or an analog arithmetic circuit using an operational amplifier.

The substrate used herein is not critical as long as an organic EL device can be stacked thereon. Where emitted light exits from the substrate side, transparent or translucent materials such as glass, quartz and resins are employed. The substrate may be provided with a color filter film, a fluorescent material-containing color conversion film or a dielectric reflecting film for controlling the color of light emission. Where emitted light exits from the side opposite to the substrate, the substrate may be either transparent or opaque. Ceramics may be employed as the opaque substrates.

The size of the substrate is not critical. Preferably, the substrate has a maximum length of about 200 to about 700 mm, especially about 400 to about 700 mm, which is a diagonal length for a typical rectangular substrate. Although a maximum length of less than 200 mm is not a problem, the advantage of the invention that a uniform film thickness distribution is accomplished even on substrates of larger size becomes outstanding with a maximum length of more than 200 mm. However, a substrate size in excess of 700 mm would give rise to problems including a larger size of film forming apparatus, low deposition efficiency, and difficulty of film thickness control. The apparatus of the invention is capable of precision control of the evaporation rates of source materials located at different radial positions, thereby controlling the film thickness. More particularly, by arranging a plurality of evaporation sources at concentric circles having different radii and accurately controlling the evaporation rates of these evaporation sources to the predetermined values, the thickness distribution of a film on a large size substrate is improved.

Referring to FIGS. 3 to 6, the construction and operation of the apparatus of the invention are illustrated in more detail.

Figure 3:
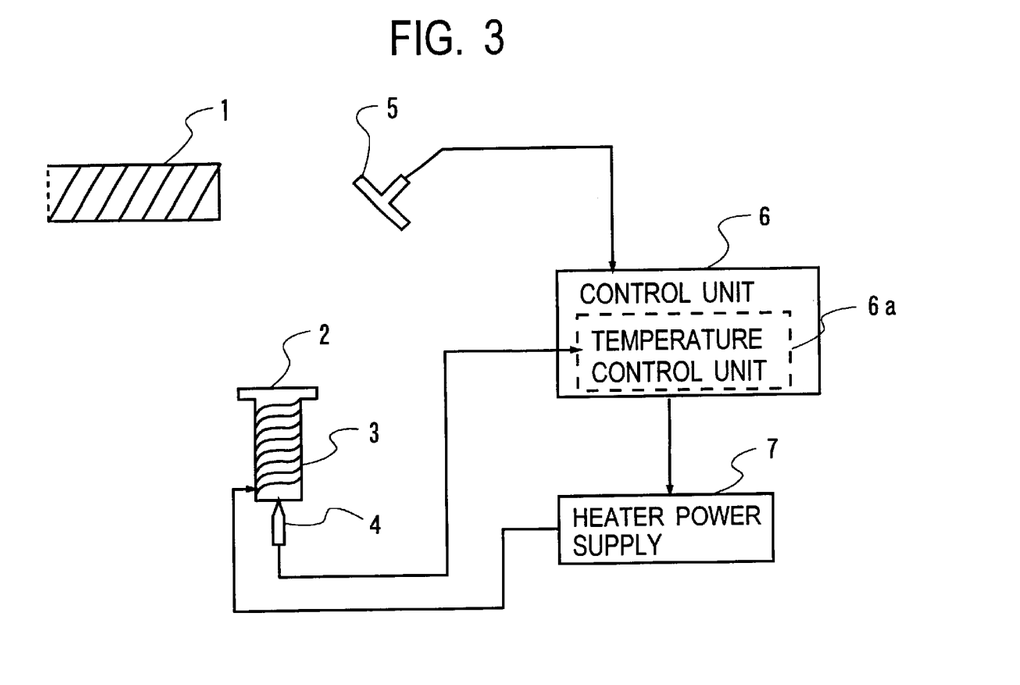
FIG. 3 is a schematic view of one exemplary arrangement of the apparatus of the invention, showing the evaporation source relative to the substrate.

FIG. 3 is a schematic view showing one exemplary construction of the apparatus for producing organic EL devices according to the invention. The apparatus includes a substrate 1 (only a part thereof is shown), an evaporation source 2 which may be either one of FIGS. 1 and 2, an evaporation rate detector 5, a control unit 6, and a heater power supply 7 coupled with the control unit 6. The evaporation source includes a container 2 and a heater 3 formed or mounted closely on the container 2 and connected to the power supply 7. A temperature sensor 4 is associated with the evaporation source 2 for detecting the temperature of the source. The detector 5 and the sensor 4 are coupled to the control unit 6 so that the control unit 6 receives a signal representative of the evaporation rate detected by the detector 5 and a signal representative of the source temperature detected by the sensor 4. The control unit 6 includes a temperature control unit 6a which functions to control the power supply 7 on the basis of the temperature data detected by the sensor 4, so that the temperature of the evaporation source may become the predetermined value (or present temperature). The power supply 7 supplies a controlled electric current or power to the heater 3 to generate the necessary heat.

Figure 4:
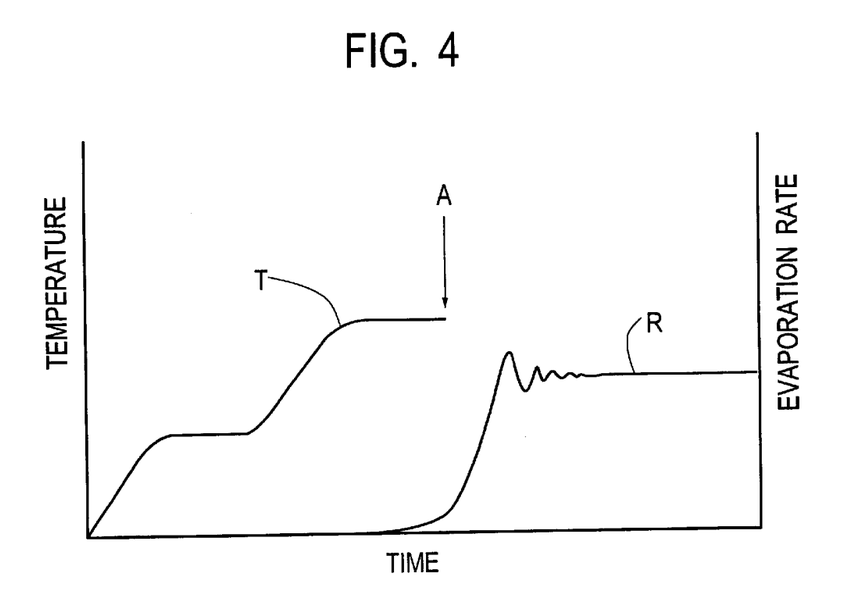
FIG. 4 is a graph showing how to control with time the temperature of an evaporation source and the evaporation rate in a first example of the invention.

In the apparatus thus constructed, the temperature of the evaporation source is controlled at the start of evaporation as shown in FIG. 4. More particularly, the control unit 6, specifically the temperature control unit 6a controls the power supply 7 such that the evaporation source 2 is heated until the predetermined value (or preset temperature) is reached. The temperature T of the evaporation source rises as shown by the left curve in the graph of FIG. 4.

When the temperature T of the evaporation source reaches stable point A of the predetermined value, the control unit 6 changes over its control mode from the temperature control to the evaporation rate control. Switching from the control by the temperature control unit 6a, the control unit 6 now directly controls the power supply 7 so as to provide the predetermined evaporation rate. The evaporation rate R rises further and stabilizes at the predetermined value. In this way, the source temperature is controlled before the start of evaporation and once the evaporating temperature reaches the predetermined value, the evaporation rate is controlled. As a consequence, the rise time of evaporation rate becomes short, the hunting phenomenon and fluctuation or variation of deposition rate are suppressed, and stable evaporation takes place. The thin film thus deposited becomes uniform in quality and thickness.

In the above embodiment, dual shutters are provided between the evaporation source and the substrate, one straight above the evaporation source and one immediately below the substrate. The shutter on the evaporation source side is opened at the start of measurement of the evaporation rate, and the shutter on the substrate side is opened at the start of deposition after the evaporation rate is stabilized. Then the source material starts to deposit on the substrate after the evaporation rate is stabilized. The invention thus achieves film deposition and control at high precision.

In the graph of FIG. 4, the temperature T of the evaporation source is increased stepwise. Stepwise heating is a kind of preheating also known as soaking which is generally intended for drying and is effective herein for the evaporation of organic materials. By carrying out initial heating under temperature control, effective soaking is achieved.

The temperature control unit 6a may be constructed such that it may operate either as a part of the control unit 6 (in hardware or software) or independently of the control unit 6. When a conventional temperature control unit is used in its original state, it may be controlled as a unit separate and independent from the control unit 6. The temperature control unit 6a is not particularly limited insofar as it can carry out appropriate temperature control. For example, a hardware (analog or digital circuit) to which the proportional integral differential (PID) control mode is applied or a control algorithm having the mode extended may be used.

The temperature sensor may be selected from well-known temperature sensors. A sensor capable of precise detection at the evaporating temperature of source materials is recommended. The range of temperature to be measured is usually from about 20° C. to about 800° C. although it varies with the type of source material. The temperature sensors useful in such application include thermocouples, platinum thermometers and thermistors.

Figure 5:
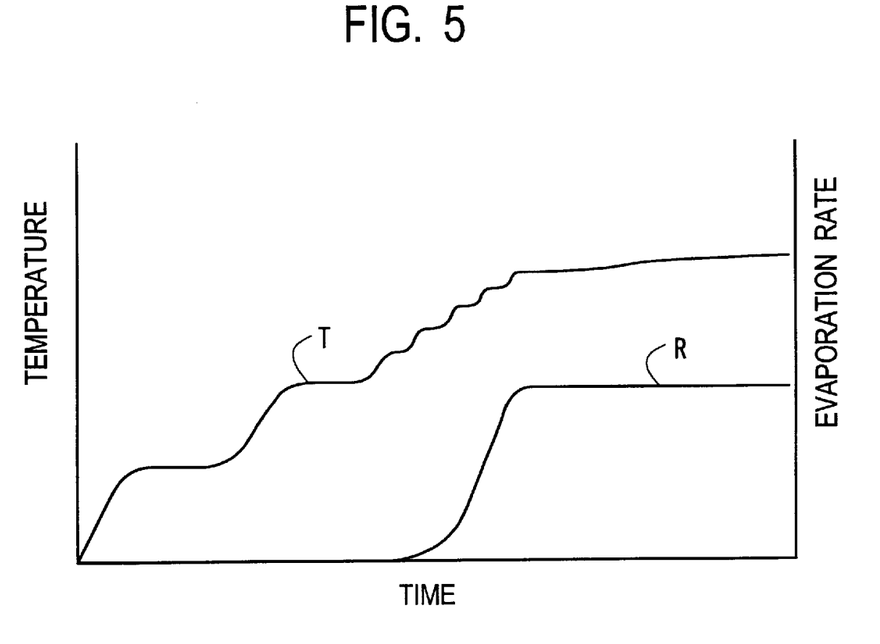
FIG. 5 is a graph showing how to control with time the temperature of an evaporation source and the evaporation rate in a second example of the invention.

FIG. 5 illustrates a second example of the apparatus of the invention. In this example, the evaporation rate is controlled at the predetermined value by controlling the temperature throughout the process. The control of the evaporation rate based on consistent temperature control eliminates the hunting phenomenon of the deposition rate which can occur in the control mode shown in FIG. 4. More illustratively, in the initial heating stage, temperature control is carried out as in FIG. 4 until the predetermined temperature is reached. In this stage too, soaking as shown in the graph is carried out, if desired.

Next, the control unit 6 carries out further heating through the temperature control unit 6a. By monitoring the deposition rate at intervals, the temperature control unit 6a (for setting the heating temperature) is controlled so that the deposition rate may become the predetermined (or preset) value. As in the first example, dual shutters provided between the evaporation source and the substrate are similarly operated. By controlling the evaporation rate by way of temperature control even after the temperature of the evaporation source 2 reaches the predetermined value, the hunting phenomenon and fluctuation or variation associated with the rise of the deposition rate can be suppressed and minimized.

In the control mode of FIG. 5 wherein temperature control is carried out, after the predetermined deposition rate is reached, so as to keep the evaporation rate constant, it is sometimes difficult to keep the deposition rate constant. To avoid the instability of control, a control mode as shown in FIG. 6 is effective.

Figure 6:
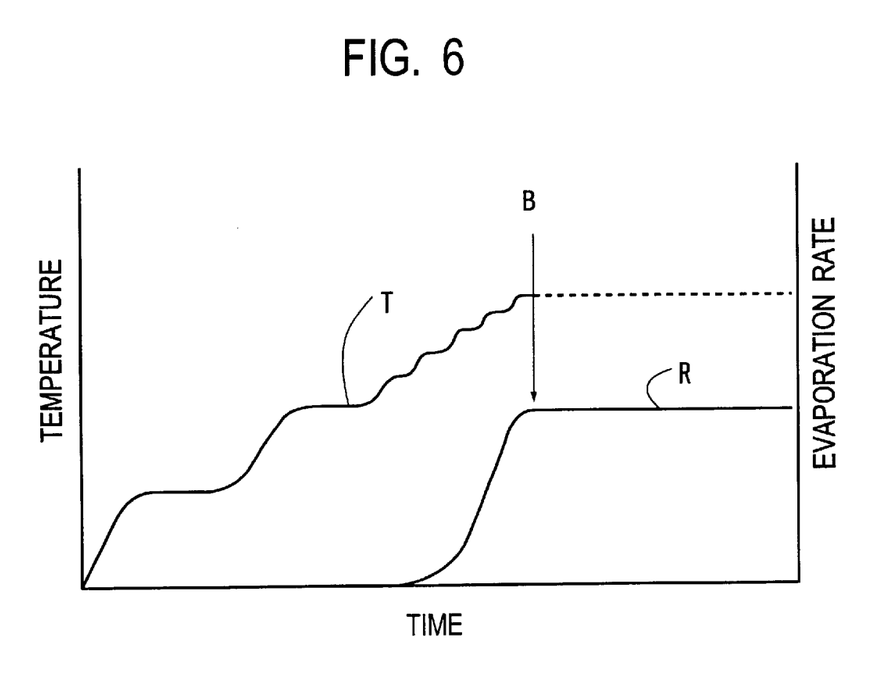
FIG. 6 is a graph showing how to control with time the temperature of an evaporation source and the evaporation rate in a third example of the invention.

FIG. 6 illustrates a third example of the apparatus of the invention. In this example, temperature control is carried out until the predetermined evaporation rate is reached, while monitoring the evaporation rate R as in the embodiment of FIG. 5. Thereafter, the control mode is changed over to the mode of directly controlling the heater power supply 7 in accordance with the evaporation rate as in the embodiment of FIG. 4. That is, the control unit 6 carries out temperature control until the evaporation rate R reaches the predetermined value, as in the example of FIG. 4, and after the evaporation rate R reaches the predetermined value B, the control unit 6 carries out control to maintain the evaporation rate R at the predetermined value B, by controlling the heater power supply 7 directly and not by way of the temperature control unit 6a, for controlling the electric current or power to the heater 3. This example is effective for restraining the temperature T from rising after the evaporation rate is stabilized, which can occur in the control mode of FIG. 4.

Although several control modes using the apparatus of the invention have been described, an optimum one may be selected from them by taking into account the type of source material, the size of the apparatus and other factors.

The apparatus of the invention allows for heating control with a quick temperature rise, adequate soaking, and stable control of evaporation rate and thus enables to form an evaporated thin film of uniform quality and thickness which is difficult to form by prior art evaporation processes. The invention is thus effective in forming a functional thin film by evaporating an organic material, especially a light emitting layer of organic EL devices. The invention also enables to accurately adjust and maintain the mixing quantities of two or more organic materials or the doping quantity in two or multi-source evaporation. Organic EL devices having consistent luminous performance can be prepared in a mass-scale manufacture process.

Thin films of organic EL devices which can be formed by the apparatus of the invention include a hole injecting and transporting layer, light emitting layer, and electron injecting and transporting layer. The invention is also effective for improving film physical properties between an electrode and an organic layer as previously mentioned. Therefore, the invention is continuously applicable in forming a hole injecting electrode or electron injecting electrode.

The organic layers which can be formed according to the invention are illustrated below.

The light emitting layer contains a fluorescent material that is a compound having a light emitting capability. The fluorescent material may be at least one member selected from compounds as disclosed, for example, in JP-A 63-264692, such as quinacridone, rubrene, and styryl dyes. Also, quinoline derivatives such as metal complex dyes having 8-quinolinol or a derivative thereof as the ligand such as tris(8-quinolinolato)aluminum are included as well as tetraphenylbutadiene, anthracene, perylene, coronene, and 12-phthaloperinone derivatives. Further useful are the phenylanthracene derivatives described in JP-A 8-12600 and the tetraarylethene derivatives described in JP-A 8-12969.

It is preferred to use the fluorescent material in combination with a host material capable of light emission by itself, that is, to use the fluorescent material as a dopant. In this embodiment, the content of the fluorescent material in the light emitting layer is preferably 0.01 to 10% by weight, especially 0.1 to 5% by weight. By using the fluorescent material in combination with the host material, the light emission wavelength of the host material can be altered, allowing light emission to be shifted to a longer wavelength and improving the luminous efficacy and stability of the device.

As the host material, quinolinolato complexes are preferable, with aluminum complexes having 8-quinolinol or a derivative thereof as the ligand being more preferable. These aluminum complexes are disclosed in JP-A 63-264692, 3-255190, 5-70733, 5-258859 and 6-215874.

Illustrative examples include tris(8-quinolinolato) aluminum, bis(8-quinolinolato)magnesium, bis(benzo{f}-8-quinolinolato)zinc, bis(2-methyl-8-quinolinolato)aluminum oxide, tris(8-quinolinolato)indium, tris(5-methyl-8-quinolinolato)aluminum, 8-quinolinolatolithium, tris(5-chloro-8-quinolinolato)gallium, bis(5-chloro-8-quinolinolato)calcium, 5,7-dichloro-8-quinolinolato-aluminum, tris(5,7-dibromo-8-hydroxyquinolinolato) aluminum, and poly[zinc(II)-bis(8-hydroxy-5-quinolinyl) methane].

Also useful are aluminum complexes having another ligand in addition to 8-quinolinol or a derivative thereof. Examples include bis(2-methyl-8-quinolinolato)(phenolato) aluminum(III), bis(2-methyl-8-quinolinolato)(ortho-cresolato)aluminum(III), bis(2-methyl-8-quinolinolato) (meta-cresolato)aluminum(III), bis(2-methyl-8-quinolinolato)(para-cresolato)aluminum(III), bis(2-methyl-8-quinolinolato)(ortho-phenylphenolato)aluminum(III), bis (2-methyl-8-quinolinolato)(meta-phenylphenolato) aluminum(III), bis(2-methyl-8-quinolinolato)(para-phenylphenolato)aluminum(III), bis(2-methyl-8-quinolinolato)(2,3-dimethylphenolato)aluminum(III), bis(2-methyl-8-quinolinolato)(2,6-dimethylphenolato)aluminum (III), bis(2-methyl-8-quinolinolato)(3,4-dimethylphenolato) aluminum(III), bis(2-methyl-8-quinolinolato)(3,5-dimethylphenolato)aluminum(III), bis(2-methyl-8-quinolinolato)(3,5-di-tert-butylphenolato)aluminum(III), bis(2-methyl-8-quinolinolato)(2,6-diphenyl-phenolato) aluminum(III), bis(2-methyl-8-quinolinolato)(2,4,6-triphenylphenolato)aluminum(III), bis(2-methyl-8-quinolinolato)(2,3,6-trimethylphenolato)aluminum(III), bis (2-methyl-8-quinolinolato)(2,3,5,6-tetramethylphenolato) aluminum(III), bis(2-methyl-8-quinolinolato)(1-naphtholato)aluminum(III), bis(2-methyl-8-quinolinolato) (2-naphtholato)aluminum(III), bis(2,4-dimethyl-8-quinolinolato)(ortho-phenylphenolato)aluminum(III), bis(2, 4-dimethyl-8-quinolinolato)(para-phenylphenolato) aluminum(III), bis(2,4-dimethyl-8-quinolinolato)(meta-phenylphenolato)aluminum(III), bis(2,4-dimethyl-8-quinolinolato)(3,5-dimethylphenolato)aluminum(III), bis(2, 4-dimethyl-8-quinolinolato)(3,5-di-tert-butylphenolato) aluminum(III), bis(2-methyl-4-ethyl-8-quinolinolato)(para-cresolato)aluminum(III), bis(2-methyl-4-methoxy-8-quinolinolato)(para-phenylphenolato)aluminum(III), bis(2-methyl-5-cyano-8-quinolinolato)(ortho-cresolato)aluminum (III), and bis(2-methyl-6-trifluoromethyl-8-quinolinolato) (2-naphtholato)aluminum(III).

Also acceptable are bis(2-methyl-8-quinolinolato) aluminum(III)-$\mu$-oxo-bis(2-methyl-8-quinolinolato) aluminum (III), bis(2,4-dimethyl-8-quinolinolato)aluminum (III)-$\mu$-oxo-bis(2,4-dimethyl-8-quinolinolato)aluminum (III), bis(4-ethyl-2-methyl-8-quinolinolato)aluminum(III)-$\mu$-oxo-bis(4-ethyl-2-methyl-8-quinolinolato)aluminum(III), bis(2-methyl-4-methoxyquinolinolato)aluminum(III)-$\mu$-oxo-bis(2-methyl-4-methoxyquinolinolato)aluminum(III), bis(5-cyano-2-methyl-8-quinolinolato)aluminum(III)-$\mu$-oxo-bis(5-cyano-2-methyl-8-quinolinolato)aluminum(III), and bis(2-methyl-5-trifluoromethyl-8-quinolinolato) aluminum(III)-$\mu$-oxo-bis(2-methyl-5-trifluoromethyl-8-quinolinolato)aluminum (III).

Other useful host materials are the phenylanthracene derivatives described in JP-A 8-12600 and the tetraarylethene derivatives described in JP-A 8-12969.

The light emitting layer may also serve as the electron injecting and transporting layer. In this case, tris(8-quinolinolato)aluminum etc. are preferably used.

The electron injecting and transporting compound is preferably selected from quinoline derivatives and metal complexes having 8-quinolinol or a derivative thereof as a ligand, especially tris(8-quinolinolato)aluminum (Alq3). The aforementioned phenylanthracene derivatives and tetraarylethene derivatives are also preferable.

The compound for the hole injecting and transporting layer is preferably selected from amine derivatives having strong fluorescence, for example, triphenyldiamine derivatives, styrylamine derivatives and amine derivatives having an aromatic fused ring.

The electron injecting electrode is preferably formed from materials having a low work function, for example, metal elements such as K, Li, Na, Mg, La, Ce, Ca, Sr, Ba, Al, Ag, In, Sn, Zn, and Zr, and binary or ternary alloys made of two or three such metal elements for stability improvement. Exemplary alloys are Ag-Mg (Ag: 0.1 to 50 at %), Al—Li (Li: 0.01 to 14 at %), In—Mg (Mg: 50 to 80 at %), and Al—Ca (Ca: 0.01 to 20 at %). It is understood that the electron injecting electrode can also be formed by evaporation or sputtering.

The electron injecting electrode thin film may have a sufficient thickness for electron injection, for example, a thickness of at least 0.1 nm, preferably at least 1 nm. Although the upper limit is not critical, the electrode thickness is typically about 1 to about 500 nm. On the electron injecting electrode, a protective electrode may be provided, if desired. A protective layer may be formed using metal materials, inorganic materials such as SiOx, and organic materials such as Teflon.

During evaporation, an appropriate pressure is $1\times10^{-8}$ to $1\times10^{-5}$ Torr and the heating temperature of the evaporation source is about 100° C. to about 1,400° C. for metal materials and about 100° C. to about 500° C. for organic materials.

The organic EL light-emitting device manufactured by the method of the invention has a hole injecting electrode on a substrate and an electron injecting electrode thereon. At least a hole transporting layer, a light emitting layer and an electron injecting and transporting layer are disposed between the electrodes. The device further has a protective electrode as the uppermost layer. Of these layers, the hole transporting layer, electron transporting layer, and protective electrode are omitted as the case may be.

A transparent or translucent electrode is preferred as the hole injecting electrode because a structure allowing emitted light to exit from the substrate side is typical. Useful materials for transparent electrodes include tin-doped indium oxide (ITO), zinc-doped indium oxide (IZO), zinc oxide (ZnO), tin oxide (SnO$_2$), and indium oxide (In$_2$O$_3$), with ITO and IZO being preferred. The ITO usually contains In$_2$O$_3$ and SnO in stoichiometry although the oxygen content may deviate somewhat therefrom.

The hole injecting electrode preferably has a transmittance of at least 50%, more preferably at least 60%, further preferably at least 80%, and especially at least 90% for each light emission in a luminous wavelength band, typically of 350 to 800 nm. Since the emitted light exits the device through the hole injecting electrode, the hole injecting electrode with a low transmittance causes the light emission to attenuate, failing to provide a necessary luminance as the light emitting device. Where the emitted light is taken out of the device solely from one side, it suffices that the electrode on the take-out side has a transmittance of at least 50%.

The hole injecting electrode should have a sufficient thickness for hole injection and is preferably about 50 to about 500 nm thick, especially about 50 to 300 nm thick.

container and heater were overcoated with PBN by CVD to form an insulative coating.

Sample No. 1 is of the shape of FIG. 1 having the heater on the bottom and side wall of the container. Sample Nos. 2 and 3 are of the shape of FIG. 2 having the heater on the bottom, side wall and raised portion of the container. Sample Nos. 4 to 6 are of the shape of FIG. 1, but having the heater only on the side wall of the container.

Each of the thus obtained evaporation source samples (Knudsen cells) was charged with a sublimable material Alq3 as the source material and heated to evaporate the source material into a vapor. The value of n, the effective contact area (S cm$^2$), the volume of the source material (V cm$^3$), and V/S were determined. A maximum evaporation rate was determined. A percent utilization of the source material (depositable source material/source material charge) was also determined. The results are shown in Table 1.

TABLE 1

| Sample No. | Material charge depth (mm) | Inner diameter (mm) | Opening area (cm$^2$) | n value | Heating zone contact area S:(cm$^2$) | Volume of material V (cm$^3$) | V/S | Evaporation rate (μg/sec) | Bottom heater area (cm$^2$) | Raised portion heater outer diameter (mm) | Material utilization (%) |
|---|---|---|---|---|---|---|---|---|---|---|---|
| 1 | 10 | 60 | 28.3 | 3 | 47.1 | 28.3 | 0.6 | 300 | 28.3 | — | 90 |
| 2 | 10 | 40 | 9.4 | 4 | 28.3 | 9.4 | 0.33 | 200 | 9.4 | 20 | 95 |
| 3 | 50 | 40 | 9.4 | 4 | 103.7 | 47.1 | 0.45 | 200 | 9.4 | 20 | 95 |
| 4 | 10 | 20 | 3.1 | 5 | 6.3 | 3.1* | 0.49 | 100* | — | — | 80* |
| 5 | 50 | 20 | 3.1 | 5 | 34.6 | 15.7 | 0.45 | 100* | — | — | 90 |
| 6 | 10 | 60 | 28.3 | 3 | 18.8 | 28.3 | 1.50* | 150 | — | — | 50* |
| 7 | 50 | 60 | 28.3 | 3 | 122.5 | 141.4 | 1.15* | 150 | 28.3 | — | 60* |

Sample Nos. 4 to 7 are comparative samples.
*indicates outside the scope of the invention Although no upper limit need be imposed on the thickness of the hole injecting electrode, too thick electrodes can peel off. A too thin electrode is undesirable in film strength, hole transporting capability, and resistivity.

The hole injecting electrode can be formed by evaporation or other processes although sputtering is preferable.

After the organic EL device layers are deposited, a protective film may be formed using an inorganic material such as SiOx or an organic material such as Teflon or chlorine-containing fluorocarbon polymer. The protective film may be transparent or opaque. Its thickness is typically about 50 to 1,200 nm. The protective film may be formed by reactive sputtering as well as general sputtering, evaporation and PECVD processes.

On the substrate, a color filter film, a color conversion film containing a fluorescent material, or a dielectric reflective layer may be provided for controlling the color of emitted light.

The organic EL device of the invention is generally of the dc or pulse drive type while it can be of the ac drive type. The applied voltage is generally about 2 to 30 volts.

EXAMPLE

Examples of the present invention are given below by way of illustration and not by way of limitation.

Example 1

The evaporation source (Sample Nos. 1–3 and comparative Sample Nos. 4–7) had a container which was formed by CVD from PBN into a Knudsen cell shape configured as shown in Table 1. A helical heater was formed on the container by depositing pyrolytic graphite by CVD. The As seen from Table 1, the evaporation source samples within the scope of the invention have a high evaporation rate and a high material utilization and are thus advantageous in depositing organic EL materials.

Example 2

Using the evaporation source of Example 1, there was furnished an evaporation apparatus based on the control mode of the first embodiment (FIGS. 3 and 4). The apparatus was operated to deposit a layer of Alq3 doped with coumarin on a substrate as a light emitting layer. A variation of the doping quantity was determined. Evaporation was carried out many times from the initial state that the container was fully charged with the source material until the quantity of source material was reduced to the limit above which stable evaporation was possible. Determined from a change of evaporation rate was a volume ratio of Alq3/coumarin, from which a variation of the coumarin doping quantity was calculated. The apparatus was controlled so as to provide a coumarin doping quantity of 1% by volume.

As a result, the apparatus using the comparative sample showed a doping quantity variation of ±10%, and the apparatus using the inventive sample showed a doping quantity variation of ±5%.

The evaporation source of the invention is capable of containing a large amount of source material, enables stable evaporation over a long period of time, enables to adjust and maintain uniform the thickness and composition of a thin film, and allows for evaporation at relatively low temperatures or on a substrate with a relatively large surface area. The evaporation source is useful in an apparatus and method for the preparation of an organic EL device. In the event of multi-source evaporation, the organic EL device-preparing apparatus and method can control at high precision the mixing ratio or doping amount.

Japanese Patent Application No. 10-256058 is incorporated herein by reference.

The invention has been described in detail with particular reference to preferred embodiments thereof, but it will be understood that variations and modifications can be effected within the spirit and scope of the invention.

What is claimed is:

1. An evaporation source for evaporating a source material, the evaporation source comprising a container comprising an insulator and having an exterior surface and an interior surface, the interior surface defining a volume V to hold the source material and having a surface area S, with $V/S \leq 1$ cm; and a heater in direct contact with the exterior surface of the container, wherein the container further comprises a bottom including a raised portion; and a portion of the exterior surface and a portion of the heater are inside the raised portion.

2. The evaporation source of claim 1, wherein the volume V defined by the interior surface of the container is at least 5 cm$^3$.

3. The evaporation source of claim 1, wherein the insulator has a thermal conductivity of at least 50 W/m·k.

4. The evaporation source of claim 1, wherein the container further comprises a second layer, on the heater, comprising an insulator having a thermal conductivity of at least 50 W/m·k.

5. The evaporation source of claim 4, wherein at least one of the insulator of the container and the insulator of the second layer comprises pyrolytic boron nitride; and the heater comprises carbon.

6. An apparatus comprising the evaporation source of claim 1;

a substrate and an evaporation rate detector above the evaporation source; and an evaporation source controller electrically connected to the evaporation rate detector and the evaporation source.

7. A method of using an evaporation source, the method comprising placing a source material in the evaporation source of claim 1;

actuating the heater to evaporate the source material;

detecting a rate of evaporation of the source material; and controlling the evaporation source on the basis of the detected rate of evaporation.

8. The method of claim 7, wherein the controlling of the evaporation source maintains the rate of evaporation constant.

9. The method of claim 7, wherein the controlling of the evaporation source controls a temperature of the evaporation source.

10. The method of claim 7, wherein the controlling of the evaporation source controls an electric current or power applied to the heater of the evaporation source.

11. The method of claim 7, wherein the controlling of the evaporation source includes controlling a temperature of the evaporation source, and then maintaining the rate of evaporation constant.

12. The evaporation source of claim 1, wherein the heater comprises a conductive strip deposited on the exterior surface of the container.

13. The evaporation source of claim 12, wherein conductive strip comprises graphite.

* * * * *